US 6,683,796 B2

(12) United States Patent
Radu et al.

(10) Patent No.: US 6,683,796 B2
(45) Date of Patent: Jan. 27, 2004

(54) APPARATUS FOR CONTAINING ELECTROMAGNETIC INTERFERENCE

(75) Inventors: Sergiu Radu, Fremont, CA (US); Thomas Elisha James Stewart, Saratoga, CA (US); Peter Cuong Dac Ta, Hayward, CA (US); Vernon P. Bollesen, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 206 days.

(21) Appl. No.: 10/045,912

(22) Filed: Jan. 9, 2002

(65) Prior Publication Data

US 2003/0128536 A1 Jul. 10, 2003

(51) Int. Cl.[7] .................................................. H05K 9/00
(52) U.S. Cl. ..................... 361/818; 361/816; 361/800; 361/709; 174/35; 174/51 R; 439/608; 439/609
(58) Field of Search ................. 361/818, 816, 361/800, 802, 709, 711, 752, 753, 799, 796, 813; 124/35, 51 R; 439/609, 608, 607

(56) References Cited

U.S. PATENT DOCUMENTS

| 5,357,404 A | * 10/1994 | Bright et al. ............. 174/35 R |
| 5,566,052 A | * 10/1996 | Hughes .................. 174/35 GC |
| 5,748,455 A | * 5/1998 | Phillips et al. ............. 174/35 R |
| 5,825,634 A | 10/1998 | Moorehead, Jr. |
| 6,088,231 A | 7/2000 | Fajardo |
| 6,137,051 A | 10/2000 | Bundza |
| 6,140,577 A | 10/2000 | Rapaich et al. |
| 6,198,630 B1 | 3/2001 | Cromwell |
| 6,219,239 B1 | 4/2001 | Mellberg et al. |
| 6,239,359 B1 | 5/2001 | Lilienthal, II et al. |
| 6,252,313 B1 | 6/2001 | Zhang et al. |
| 6,259,609 B1 | 7/2001 | Kurz |
| 6,269,863 B1 | 8/2001 | Wyler |
| 6,278,617 B1 | 8/2001 | Yang et al. |
| 6,288,330 B1 | 9/2001 | Chen |
| 6,324,074 B1 | * 11/2001 | Lunden .................... 174/35 R |
| 6,362,477 B1 | 3/2002 | Sowerby et al. |

OTHER PUBLICATIONS

U.S. patent application Ser. No.: 10/097,946, filed on Mar. 14, 2002.
"Identifying an EMI Source and Coupling Path in a Computer System with Sub–Module Testing", p. 165–170, Jun. 1997.
"Intel Pentium 4 Processor in the 423–pin package EMI Guideline", p. 1–9, Oct. 2000.
"Mechanical Enabling Efforts", Intel Developer Forum, Sep. 2000.

* cited by examiner

Primary Examiner—David Martin
Assistant Examiner—Hung Bui
(74) Attorney, Agent, or Firm—Meyertons Hood Kivlin Kowert & Goetzel, P.C.; B. Noël Kivlin

(57) ABSTRACT

An apparatus for containing electromagnetic interference (EMI). The apparatus includes an enclosure for an EMI producing component. The enclosure has a set of springable tabs extending from a top edge of the enclosure and a set of pins extending from a bottom edge of the enclosure. The pins are placed through a grounding ring and a printed circuit board to align and ground the enclosure. The tabs contact a heatsink disposed over the enclosure.

11 Claims, 5 Drawing Sheets

APPARATUS FOR CONTAINING ELECTROMAGNETIC INTERFERENCE

BACKGROUND OF THE INVENTION

1. Field of the Invention

The present invention relates generally to electromagnetic interference (EMI) produced by electronic components, and more specifically to containing such EMI.

2. Background Information

Electronic components such as microprocessors typically produce electromagnetic interference or noise during use. When a microprocessor is coupled with a heatspreader or lid and a heatsink, the electromagnetic noise propagates from the die and package to the heatspreader and then to the heatsink which effectively acts as an antenna to further radiate the EMI produced by the microprocessor. As the EMI is coupled to neighboring components, it interferes with their individual performance which may, in turn, affect the overall performance of a system. Because of the negative effects of EMI and because the level of acceptable radiated EMI is subject to strict regulatory limits, it is desirable to contain or suppress the EMI produced by a component.

One known technique for suppressing EMI is to ground (couple to a signal return plane) the heatsink that is coupled to the EMI producing component. For example, an EMI gasket or enclosure may be coupled to the heatsink and coupled to the printed circuit board (PCB) on which the EMI producing component is located in order to ground the enclosure via the PCB. Because of the contact between the EMI enclosure and the heatsink, the heatsink is grounded by the EMI enclosure. However, some grounding apparatuses may require a specially modified heatsink while others may interfere with the transfer of heat between the component and the heatsink.

SUMMARY OF THE INVENTION

An enclosure for an EMI producing component comprises a plurality of springable tabs extending from a top edge of the enclosure and a plurality of pins extending from a bottom edge of the enclosure. A portion of each springable tab extends above the top edge of the enclosure.

Additional features and benefits of the present invention will become apparent from the detailed description, figures and claims set forth below.

BRIEF DESCRIPTION OF THE DRAWINGS

Various embodiments of the present invention will be described in detail with reference to the following drawings. The present invention is illustrated by way of example and not limitation in the accompanying figures.

DETAILED DESCRIPTION

The description and accompanying drawings are for purposes of illustration and are not to be used to construe the invention in a restrictive manner. In the following description, specific details are set forth in order to provide a thorough understanding of the invention. However, it will be apparent to one of ordinary skill in the art that the invention can be practiced without these specific details.

As used herein, "ground" is defined as coupling to or contacting a signal return plane of a PCB.

Figure 1A:
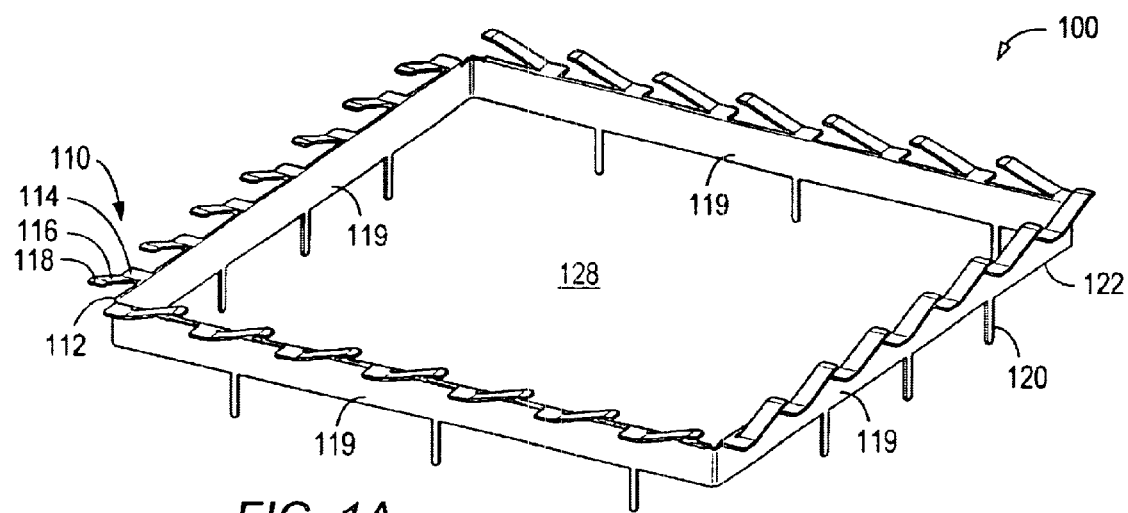
FIG. 1A illustrates a perspective view of one embodiment of an enclosure for an EMI producing component in accordance with the teachings of the present invention.
Figure 1B:
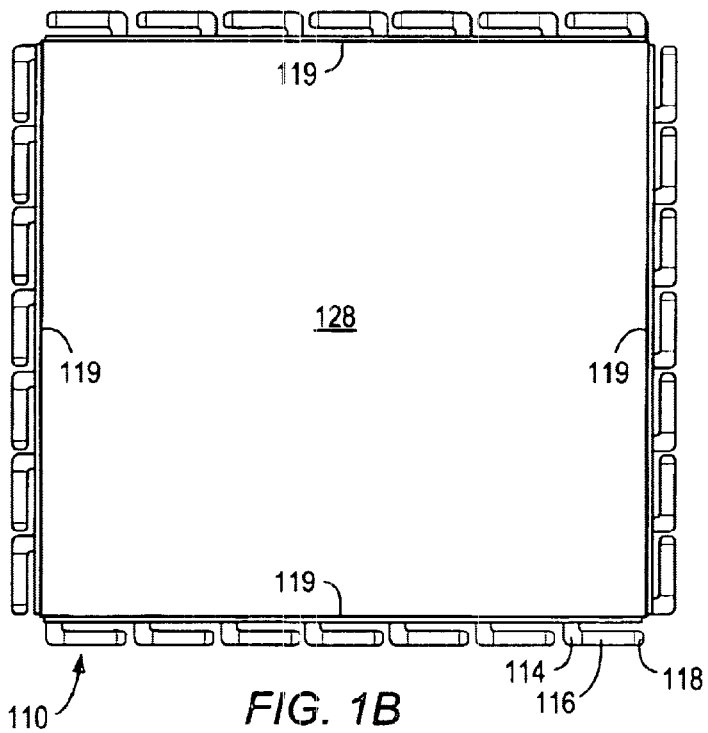
FIG. 1B illustrates a top view of the enclosure shown in FIG. 1A.
Figure 1C:
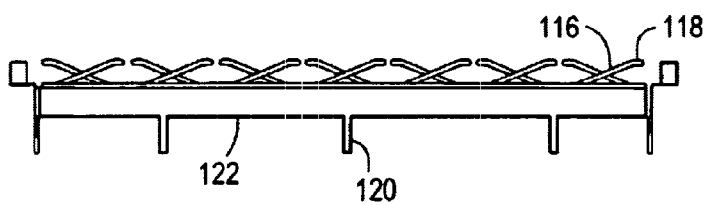
FIG. 1C illustrates a side view of the enclosure shown in FIG. 1A.

FIGS. 1A–1C illustrate different views of one embodiment of an enclosure for an EMI producing component. An enclosure 100 has a number of springable tabs 110 extending from a top edge 112 of enclosure 100. Each springable tab 110 includes a base 114, an arm 116 and an end 118. Base 114 is coupled to top edge 112 and extends out from enclosure 100. Arm 116 is integrally formed with base 114 and extends from base 114 at an angle. End 118 is integrally formed with arm 116 and extends from arm 116 in a substantially parallel manner relative to top edge 112.

Enclosure 100 bounds an area 128 for an EMI producing component. Arm 116 and end 118 of each springable tab 110 extend above top edge 112 of enclosure 100. Additionally, no portion of arm 116 or end 118 extends over area 128. Thus, springable tabs 110 do not interfere with a thermal path between an EMI producing component surrounded by enclosure 100 and a heatsink placed over enclosure 100 and the EMI producing component.

Each springable tab 110 is flexible at the junction between base 114 and arm 116. In one embodiment, each springable tab 110 is elastically deformable. Thus, end 118 and arm 116 return close to their original position when end 118 or arm 116 is released after being depressed.

Springable tabs 110 are shown located in a regular pattern along top edge 112 of enclosure 100. Specifically, springable tabs 110 are oriented counter-clockwise around the perimeter of enclosure 100 and are spaced at regular intervals along each side 119 of enclosure 100. Thus, springable tabs 110 may provide multiple, regular contact points to help ground a heatsink and contain EMI more effectively. It is appreciated that springable tabs 110 may be oriented in a variety of patterns and that the embodiment shown in FIGS. 1A–1C is only one example.

Enclosure 100 has a number of pins 120 extending from a bottom edge 122 of enclosure 100. Pins 120 are integrally formed with enclosure 100 and extend straight from bottom edge 122. In one embodiment, pins 120 are grounding pins that are placed into a PCB to ground enclosure 100 when enclosure 100 is placed around an EMI producing component on the PCB. Pins 120 may also be used to help align enclosure 100 around an EMI producing component when they are mated with corresponding holes in the PCB. Because pins 120 extend vertically from bottom edge 122 of enclosure 100, they do not take up additional space on the surface of a PCB when enclosure 100 is placed around an EMI producing component. An equal number of pins 120 are shown extending from each side 119, but it is appreciated that a varying number of pins and pin configurations may be used to ground and/or align enclosure 100.

Enclosure 100, springable tabs 110 and pins 120 may be formed of metal or any other material suitable for grounding as is commonly known.

Figure 2A:
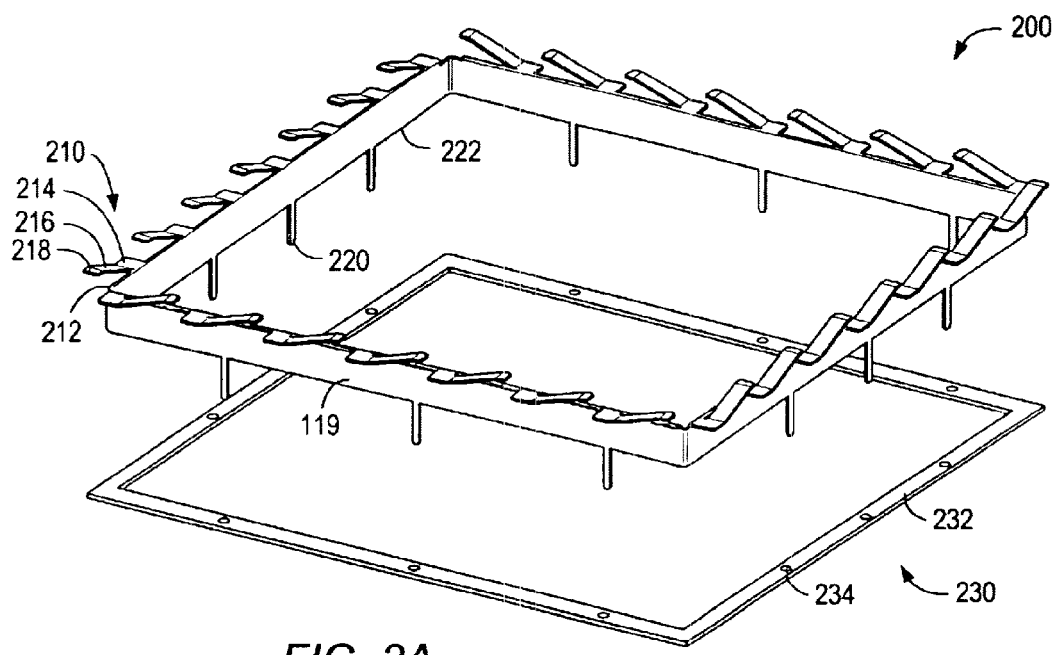
FIG. 2A illustrates a perspective view of one embodiment of an enclosure and a grounding ring for an EMI producing component in accordance with the teachings of the present invention.

FIG. 2A illustrates a perspective view of one embodiment of an enclosure and a grounding ring for an EMI producing component. Enclosure 200 has a plurality of contacts 210 extending from a top edge 212 of enclosure 200. Each contact 210 includes a base 214, an arm 216 and an end 218. Base 214 is coupled to top edge 212 and extends out from enclosure 200. Arm 216 extends upward from base 214 at an angle to top edge 212. End 218 is substantially level to provide a contact area. It is appreciated that end 218 may be formed alternatively. For example, end 218 may be formed with a bump or raised area. Contacts 210 are spring-like, allowing end 218 and arm 216 to return to close to their original position when they are released after being pushed down. Because contacts 210 may be depressed individually and are not rigid, contact may be made more easily with all of the contacts 210 by, for example, a heatsink disposed over enclosure 200.

Enclosure 200 has a plurality of pins 220 extending from a bottom edge 222 of enclosure 200. Pins 220 are integrally formed with enclosure 200 and extend vertically from bottom edge 222. In one embodiment, pins 220 are grounding pins that are placed into a PCB to ground enclosure 200 when enclosure 200 is placed around an EMI producing component on the PCB. Pins 220 may also be used to help align enclosure 200 around an EMI producing component when they are placed through corresponding holes in the PCB.

A grounding ring 230 with a plurality of through holes 234 has an outline similar to that of enclosure 200 such that enclosure 200 may be placed directly over grounding ring 230 and make contact along top surface 232 of grounding ring 230. In one embodiment, grounding ring 230 is wide enough to accommodate the width of enclosure 200 such that enclosure 200 is disposed entirely on top surface 232 of grounding ring 230. Each pin 220 of enclosure 200 is placed through one of the through holes 234 of grounding ring 230. Once pins 220 are placed through through holes 234, which are metalized in one embodiment, bottom edge 222 of enclosure 200 rests on top surface 232 of grounding ring 230. In one embodiment, grounding ring 230 is a wide conductive trace on a top layer of a PCB and may be formed as part of an etching process. In another embodiment, grounding ring 230 is a separate metal piece which is placed on top of a PCB.

Figure 2B:
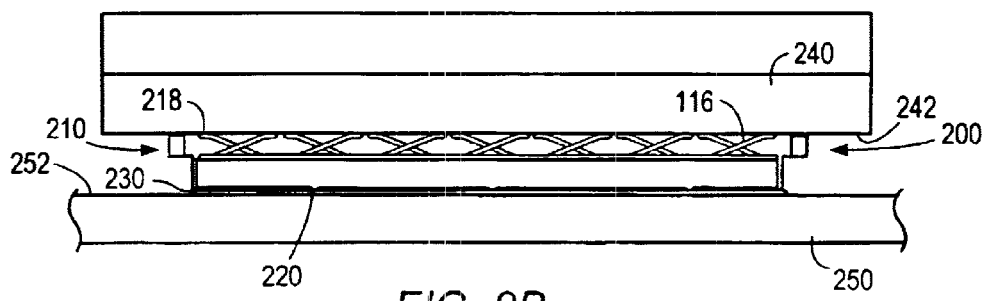
FIG. 2B illustrates a side view of one embodiment of an apparatus for containing EMI in accordance with the teachings of the present invention.
Figure 2C:
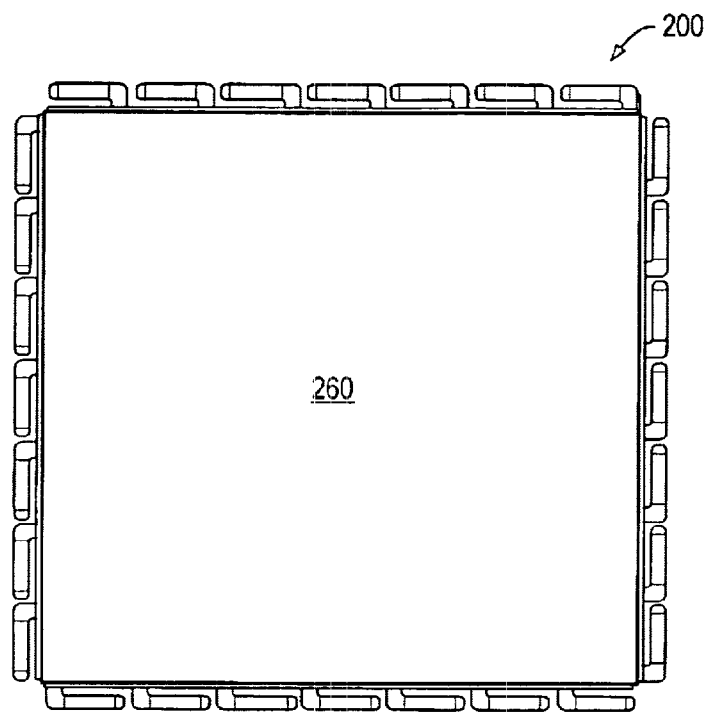
FIG. 2C illustrates a top view of one aspect of the apparatus shown in FIG. 2B.

FIG. 2B illustrates a side view of an apparatus for containing EMI using enclosure 200 and grounding ring 230. FIG. 2C illustrates a top view of one aspect of the apparatus. Grounding ring 230 is on a top surface 252 of a PCB 250 around an EMI producing component. Grounding ring 230 is coupled to a signal return plane (not shown) of PCB 250 by vias (not shown) to create a low inductance path to the signal return plane. In one embodiment, there are at least four vias per inch along grounding ring 230. Enclosure 200 is disposed on top of grounding ring 230 and aligned by placing pins 220 through through holes 234 of grounding ring 230 and corresponding through holes (not shown) in PCB 250. Pins 220 go through a signal return plane of the PCB and are soldered in place.

In one embodiment, the through holes in PCB 250 are metalized to provide better connection between pins 220 and the signal return plane when pins 220 are soldered in the through holes of PCB 250. It is appreciated that pins 220 may go through more than one signal return plane, as may exist in some multi-layer PCBs. In another embodiment, grounding ring 230 is coupled to the grounding pins of the surrounded component 260, which may be a central processing unit (CPU) for example.

A heatsink 240 is placed over enclosure 200. A bottom surface 242 of heatsink 240 contacts ends 218 of contacts 210, thereby grounding heatsink 240. As heatsink 240 is pressed down on enclosure 200, contacts 210 are depressed and heatsink 240 is pressed into contact with component 260. Once heatsink 240 is in place, component 260 is completely surrounded and EMI may be contained more effectively. Heatsink 240 may be coupled to PCB 250 or otherwise held in place by commonly known methods. Because no part of contacts 210 extends over the area enclosed by enclosure 200 (see FIG. 2C), heatsink 240 may be placed in direct contact with component 260. Thus, contacts 210 do not interfere with the transfer of heat between component 260 and heatsink 240. When heatsink 240 is placed over enclosure 200, there are "360 degrees" of contact between heatsink 240 and a signal return plane of PCB 250 due to enclosure 200.

It is appreciated that heatsink 240 may have fins or other features found on typical heatsinks. A typical heatsink having a flat bottom surface may be used with enclosure 200. Additionally, a heatspreader or lid may be used with the heatsink.

FIGS. 3A–3D illustrate different views of another embodiment of an enclosure for an EMI producing component. An enclosure 300 has a first set of springable tabs 310a extending from a top edge 312a of enclosure 300. Each springable tab 310a includes abase 314a, an arm 316a and an end 318a. Base 314a is coupled to top edge 312a and extends out from enclosure 300. Arm 316a is integrally formed with base 314a and extends up from base 314a at a non-orthogonal angle. End 318a is integrally formed with arm 316a and is substantially parallel to top edge 312a.

Figure 3A:
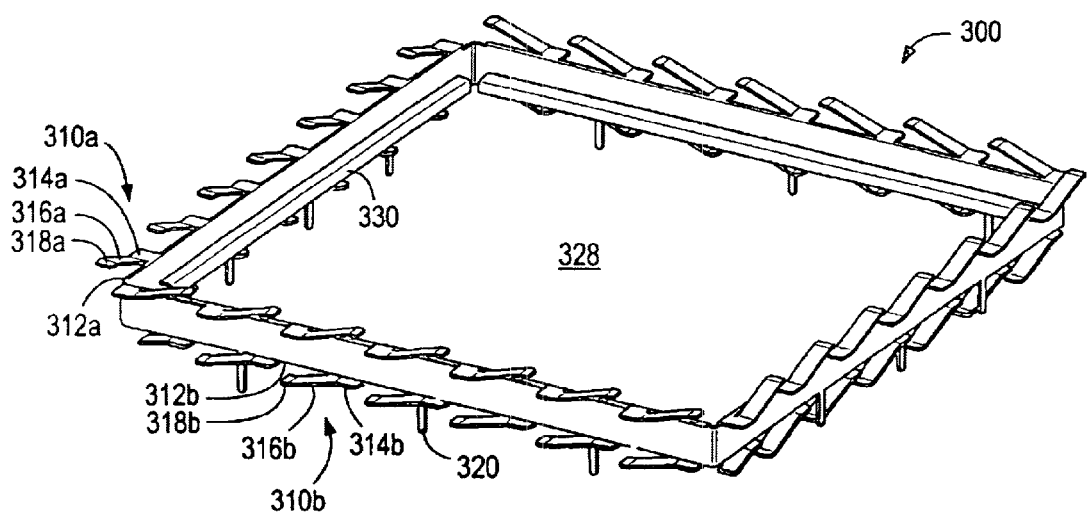
FIG. 3A illustrates a perspective view of another embodiment of an enclosure for an EMI producing component in accordance with the teachings of the present invention.
Figure 3B:
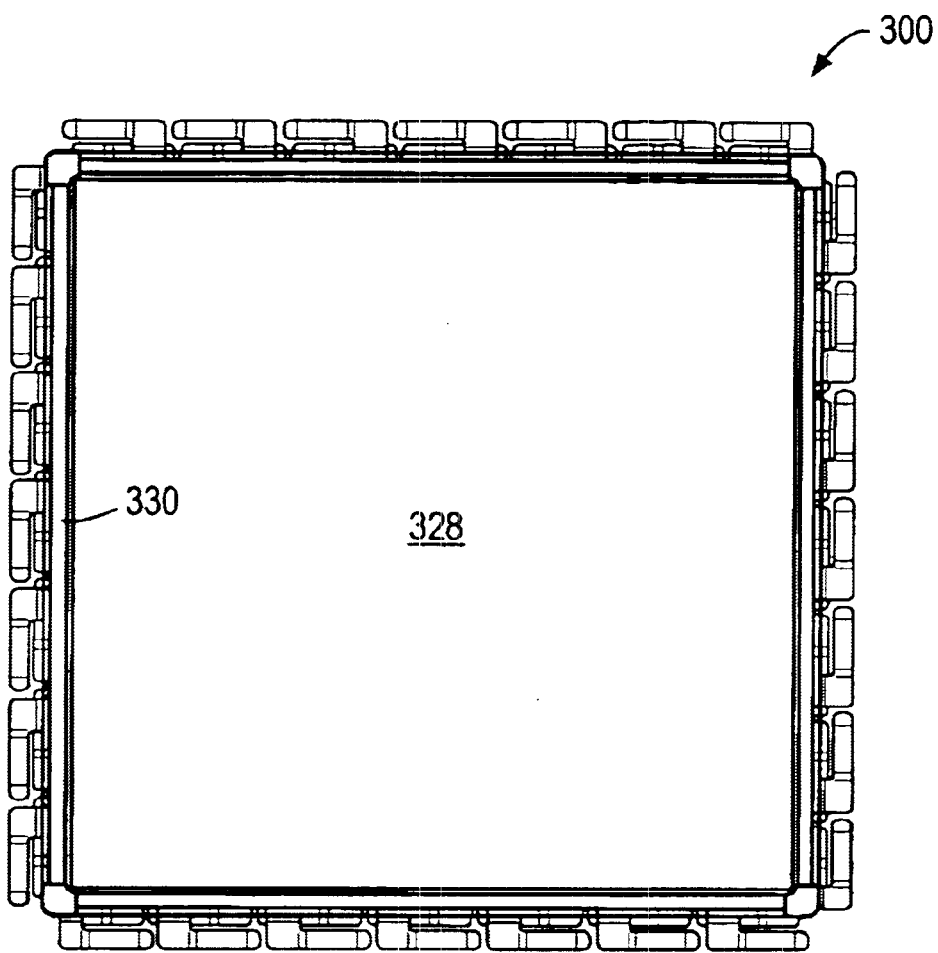
FIG. 3B illustrates a top view of the enclosure shown in FIG. 3A.
Figure 3C:
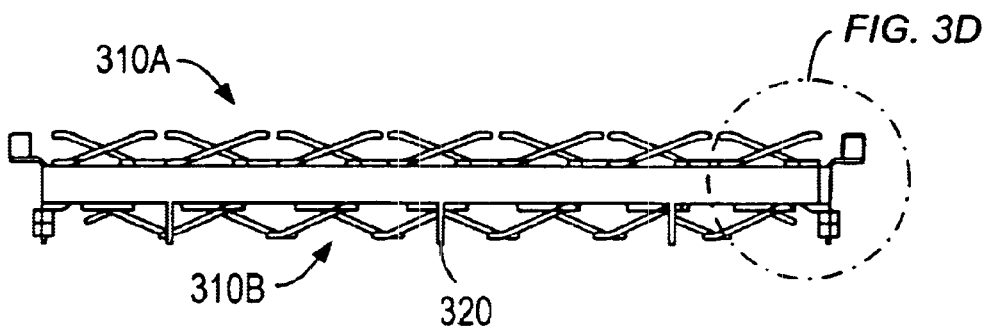
FIG. 3C illustrates a side view of the enclosure shown in FIG. 3A.
Figure 3D:
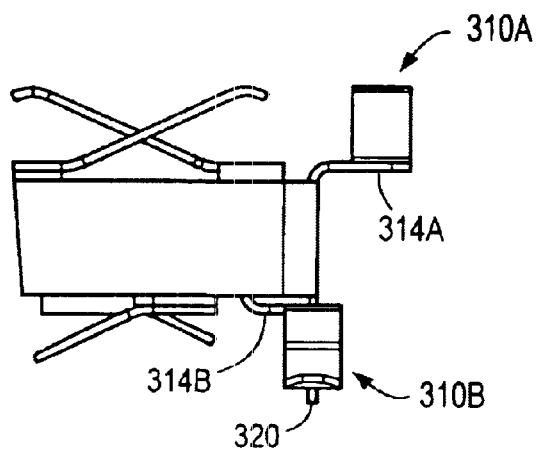
FIG. 3D illustrates a detailed view of a portion of FIG. 3C.

Enclosure 300 has a second set of springable tabs 310b extending from a bottom edge 312b of enclosure 300. Bottom edge 312b is the bottom surface of ridge 330. Each springable tab 310b includes abase 314b, an arm 316b and an end 318b. Base 314b is coupled to bottom edge 312b and extends out from enclosure 300. Arm 316b is integrally formed with base 314b and extends down from base 314b at a non-orthogonal angle. End 318b is integrally formed with arm 316b and is substantially parallel to bottom edge 312b. It is appreciated that base 314a and base 314b may extend out from enclosure 300 at different distances, as can be seen in FIGS. 3A and 3D, in which base 314b is offset from base 314a. For example, base 314b may extend out at a distance such that springable tabs 310b may be aligned with a conductive trace on the top surface of a PCB.

Enclosure 300 bounds an area 328 for an EMI producing component. No portion of springable tabs 310a, 310b extends across area 328. Thus, springable tabs 310a do not interfere with a thermal path between an EMI producing component surrounded by enclosure 300 and a heatsink placed over enclosure 300 and the EMI producing component. Enclosure 300 also has a plurality of pins 320 extending from bottom edge 312b. Pins 320 may be used to align enclosure 300 and help hold enclosure 300 in place when enclosure 300 is placed on a PCB.

Each one of springable tabs 310a, 310b is flexible at the junction between the base and the arm. Springable tabs 310a, 310b may be depressed individually and are resilient. Thus, contact may be made more easily with all of the springable tabs 310a by a heatsink placed over enclosure 300. Springable tabs 310b act as "feet" for enclosure 300 when enclosure 300 is placed on a surface such as the top surface of a grounding ring (see FIG. 4, for example).

Figure 4:
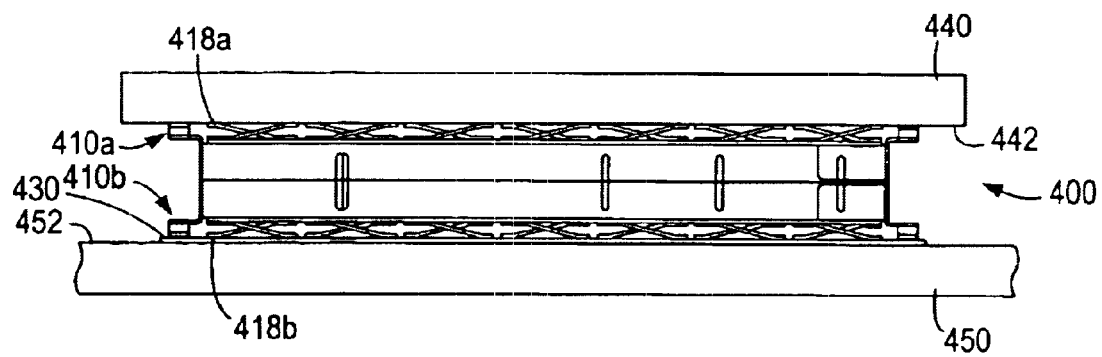
FIG. 4 illustrates a side view of another embodiment of an apparatus for containing EMI in accordance with the teachings of the present invention.

FIG. 4 illustrates a side view of an apparatus for containing EMI using an enclosure 400 and grounding ring 430. Grounding ring 430 is on a top surface 452 of a PCB 450 around an EMI producing component and is shaped similarly to grounding ring 230. Grounding ring 430 is coupled to at least one signal return plane (not shown) of PCB 450 by vias (not shown) to create a low inductance path back to the signal return plane. In one embodiment, there are at least four vias per inch along grounding ring 430. Enclosure 400 is placed on top of grounding ring 430 such that ends 418b of flexible contacts 410b are in contact with the top surface of grounding ring 430. Thus, there are multiple points of contact between enclosure 400 and grounding ring 430 at regular intervals to help ground enclosure 400. Enclosure 400 surrounds the EMI producing component.

A heatsink 440 is placed over enclosure 400. A bottom surface 442 of heatsink 440 contacts ends 418a of flexible contacts 410a. As heatsink 440 is pressed down on enclosure 400, contacts 410a and 410b are depressed and heatsink 440 is pressed into contact with the EMI producing component surrounded by enclosure 400. Heatsink 440 may be coupled to PCB 450 or otherwise held in place by commonly known methods. Once heatsink 440 is pushed down and held in place, enclosure 400 is compressed between heatsink 440 and grounding ring 430 and prevented from moving.

It is appreciated that enclosure 400 may be formed with grounding/alignment pins such as pins 220 to help further ground and align enclosure 400. In such an embodiment, grounding ring 430 and PCB 450 are formed with through holes such as those described with respect to FIGS. 2A and 2B.

In the foregoing detailed description, the present invention has been described with reference to specific exemplary embodiments. However, it will be evident that various modifications and changes may be made without departing from the broader scope and spirit of the present invention. The present specification and figures are accordingly to be regarded as illustrative rather than restrictive.

What is claimed is:

1. An enclosure for an EMI producing component, the enclosure comprising:
   a first plurality of springable tabs extending from a top edge of the enclosure, wherein a portion of each springable tab of said first plurality of springable tabs extends above said top edge; and
   a second plurality of springable tabs extending from a bottom edge of the enclosure, wherein each of said springable tabs comprises a base, wherein said bases extend outward from the bottom edge such that said second plurality of springable tabs is offset from said first plurality of springable tabs, wherein a portion of each springable tab of said second plurality of springable tabs extends from the base to below said bottom edge.

2. The enclosure of claim 1, wherein said first and second pluralities of springable tabs extend out from said enclosure.

3. The enclosure of claim 1, wherein said portion of each springable tab of said first and second pluralities of springable tabs has an end substantially parallel to one of said top edge and bottom edge.

4. An apparatus for containing EMI, the apparatus comprising:
   a grounding ring on a top surface of a printed circuit board around an EMI producing component;
   an enclosure disposed on top of said grounding ring, said enclosure comprising a first plurality of contacts extending from a top edge of said enclosure, wherein said first plurality of contacts are comprised of substantially flat contact ends, and a second plurality of contacts extending from a bottom edge of said enclosure, wherein said second plurality of contacts are in contact with said grounding ring; and
   a heat sink disposed over said component, wherein a bottom surface of said heat sink is in contact with said component and said first plurality of contacts.

5. The apparatus of claim 4, wherein said enclosure is held in place by said heat sink pushing down on said enclosure.

6. The apparatus of claim 5, wherein said heat sink is coupled to said printed circuit board.

7. An apparatus for containing EMI, the apparatus comprising:
   a grounding ring on a top surface of a printed circuit board around an EMI producing component;
   an enclosure disposed on top of said grounding ring, said enclosure comprising a first plurality of contacts extending from a top edge of said enclosure and a second plurality of contacts extending from a bottom edge of said enclosure, wherein said first plurality of contacts comprise springable tabs, wherein said second plurality of contacts are in contact with said grounding ring; and
   a heat sink disposed over said component, wherein a bottom surface of said heat sink is in contact with said component and said first plurality of contacts.

8. An apparatus for containing EMI, the apparatus comprising:
   a grounding ring on a top surface of a printed circuit board around an EMI producing component;
   an enclosure disposed on top of said grounding ring, said enclosure comprising a first plurality of contacts extending from a top edge of said enclosure and a second plurality of contacts extending from a bottom edge of said enclosure wherein said second plurality of contacts are in contact with said grounding ring;
   a heat sink disposed over said component, wherein a bottom surface of said heat sink is in contact with said component and said first plurality of contacts; and
   wherein said first plurality of contacts comprise springable tabs, wherein said springable tabs are configured to be resiliently urged against a bottom surface of said heat sink during use.

9. The apparatus of claim 8, wherein said enclosure is held in place by said heat sink pushing down on said enclosure.

10. The apparatus of claim 8, wherein said heat sink is coupled to said printed circuit board.

11. The apparatus of claim 8, wherein said contacts of said enclosure do not interfere with a thermal path between said component and said heat sink.

* * * * *